(12) United States Patent
Oyama

(10) Patent No.: US 10,942,554 B2
(45) Date of Patent: Mar. 9, 2021

(54) PORTABLE ELECTRONIC APPARATUS WITH NOTIFICATION BASED ON BATTERY REMAINING POWER

(71) Applicant: SEIKO EPSON CORPORATION, Tokyo (JP)

(72) Inventor: Shoichi Oyama, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 273 days.

(21) Appl. No.: 16/356,155

(22) Filed: Mar. 18, 2019

(65) Prior Publication Data

US 2019/0286207 A1 Sep. 19, 2019

(30) Foreign Application Priority Data

Mar. 19, 2018 (JP) .............................. JP2018-050960

(51) Int. Cl.
| | | |
|---|---|---|
| G06F 1/00 | (2006.01) |
| G06F 11/30 | (2006.01) |
| G06F 1/28 | (2006.01) |
| G06F 1/16 | (2006.01) |
| G06F 1/18 | (2006.01) |
| G06N 20/00 | (2019.01) |
| H02J 7/00 | (2006.01) |
| G01R 31/382 | (2019.01) |
| G01R 31/396 | (2019.01) |
| G01S 19/34 | (2010.01) |
| H02J 7/35 | (2006.01) |
| G06N 5/04 | (2006.01) |

(52) U.S. Cl.
CPC ............ *G06F 1/28* (2013.01); *G01R 31/382* (2019.01); *G01R 31/396* (2019.01); *G01S 19/34* (2013.01); *G06F 1/163* (2013.01); *G06F 1/189* (2013.01); *G06N 5/04* (2013.01); *G06N 20/00* (2019.01); *H02J 7/0047* (2013.01); *H02J 7/35* (2013.01)

(58) Field of Classification Search
CPC combination set(s) only.
See application file for complete search history.

(56) References Cited

U.S. PATENT DOCUMENTS

| | | | | |
|---|---|---|---|---|
| 2009/0054100 | A1* | 2/2009 | Ishida | H04N 21/47214 455/556.1 |
| 2011/0039606 | A1* | 2/2011 | Kim | H04W 52/0261 455/574 |
| 2012/0083258 | A1* | 4/2012 | Rabii | H04W 52/0261 455/418 |
| 2017/0011210 | A1* | 1/2017 | Cheong | G06F 21/32 |
| 2017/0267119 | A1* | 9/2017 | Park | B60L 58/12 |

FOREIGN PATENT DOCUMENTS

JP 2009-296427 A 12/2009

* cited by examiner

*Primary Examiner* — Nitin C Patel
(74) *Attorney, Agent, or Firm* — Oliff PLC

(57) ABSTRACT

An acquisition unit receives a result of user's selection of an exercise. A time-available-for-operation calculation unit calculates a time available for operation for which an operation on an amount of remaining power of a secondary battery is possibly continued. The determination unit compares a measurement prediction time for which the selected exercise is measured and the time available for operation. When it is determined that the measurement prediction time is longer than the time available for operation, the notification unit notifies a user before the exercise is started.

11 Claims, 7 Drawing Sheets

PORTABLE ELECTRONIC APPARATUS WITH NOTIFICATION BASED ON BATTERY REMAINING POWER

CROSS-REFERENCES TO RELATED APPLICATIONS

This application claims priority to Japanese Patent Application No. 2018-050960, filed on Mar. 19, 2018, the entirety of which is herein incorporated by reference.

BACKGROUND

1. Technical Field

The invention relates to a portable electronic apparatus such as an electronic wrist timepiece.

2. Related Art

A portable electronic apparatus is provided such as a global positioning system (GPS) sports watch dedicated for a sport, particularly running or swimming. This is an electronic apparatus that continues to locate a current position of a user using GPS and thus keeps a record of a traveling distance, a pace, a trace of a place that the user passes by on a map, and the like while the user is running. As a problem with this GPS sports watch, in a case where an amount of remaining power of a battery is used up while training is being measured, in some cases, the measurement is interrupted while in progress and the training cannot be measured to the end. The user can cope with this problem by, for example, charging the battery if the user can know whether or not the amount of remaining power of the battery is used up during a duration from a point in time at which the measurement is started to a point in time at which the measurement is completed. Regarding a technology that alerts the user to the amount of remaining power of the battery, there is a technology that is disclosed in JP-A-2009-296427. In the technology that is disclosed in JP-A-2009-296427, a time by which the amount of remaining power of the battery is reduced from a first level of the amount of remaining power to a second level of the amount of remaining power is obtained and estimation time notification means provides a notification a given time before the reduction time has elapsed.

However, in the technology that is disclosed in JP-A-2009-296427, a timing for notification is set irrespective of training measurement, and because of this, in some cases, the notification is provided after training is started. In such a case, the user who receives the notification cannot take a suitable corrective action, and when the amount of remaining power of the battery is used up while the training is in progress, there is a problem in which the measurement cannot be made until the training is ended.

SUMMARY

A portable electronic apparatus according to an aspect of the invention includes: a measurement unit that measures exercise information on a user; a battery that supplies power to the measurement unit; and a processor, in which the processor includes a first information calculation unit that calculates an amount of remaining power of the battery, a second information calculation unit that calculates a predicted amount of consumption power consumed from start to end of the training, a determination unit that compares the amount of remaining power of the battery and the predicted amount of consumption power, and a notification unit that notifies the user before an exercise is started, when it is determined in the determination unit that the predicted amount of consumption power is larger than the amount of remaining power of the battery.

According to the portable electronic apparatus, in a case where second information is larger than first information, the notification is provided to the user before the exercise is started. Therefore, the measurement of the exercise can be prevented from being interrupted while in progress.

In a preferable aspect, the second information calculation unit calculates the predicted amount of consumption power based on the measurement prediction time that elapsed from when the measurement of the exercise information was started to when the measurement was ended.

According to this aspect, because the predicted amount of consumption power can be calculated based on the measurement prediction time, the predicted amount of consumption power can be exactly obtained.

In a preferable aspect, the portable electronic apparatus includes a solar battery, the first information calculation unit calculates a predicted amount of power to be generated by the solar battery from when the measurement of the exercise information is started to when the measurement is ended, and the amount of remaining power of the battery is an amount of power that results from adding the predicted amount of power to be generated by the solar battery.

According to this aspect, the amount of remaining power of the battery can be exactly obtained.

In a more preferable aspect, the determination unit calculates a charging time necessary to charge the battery based on an amount of power that corresponds to a difference between the predicted amount of consumption power within the measurement prediction time and the amount of remaining power of the battery, and the notification unit provides notification of the charging time.

According to this aspect, the charging time is notified and because of this, the user easily determines a corrective action that has to be taken by the user himself/herself, such as the charging of the battery.

A portable electronic apparatus according to another aspect of the invention includes: a measurement unit that measures exercise information on a user; a battery that supplies power to the measurement unit; and a processor in which the processor includes a first information calculation unit that calculates a time available for operation based on an amount of remaining power of the battery, a second information calculation unit that calculates a measurement prediction time corresponds to a measurement period from start to end of the training, a determination unit that compares the time available for operation and the measurement prediction time, and a notification unit that notifies the user before an exercise is started, when it is determined in the determination unit that the measurement prediction time is longer than the time available for operation.

According to the portable electronic apparatus, in a case where second information is larger than first information, the notification is provided to the user before the exercise is started. Therefore, the measurement of the exercise can be prevented from being interrupted while in progress.

In a preferable aspect, the portable electronic apparatus includes a solar battery, and the first information calculation unit calculates the time available for operation based on the amount of remaining power of the battery and an amount of power that is generated by the solar battery.

In a preferable aspect, the portable electronic apparatus includes a measurement condition adjustment unit that adjusts a condition for the measurement by the measurement unit with user's determination, the measurement condition adjustment unit calculates a condition for changing the measurement condition under which the time available for operation is set to be the measurement prediction time or higher, based on the amount of remaining power of the battery, and the notification unit that notifies the user of the condition for the changing.

According to this aspect, with the adjustment of the measurement condition, it is possible that the first information is set to be the second information or larger and that the ending of the measurement of the exercise is avoided and thus the measurement of the exercise is started.

In a preferable aspect, the measurement condition adjustment unit calculates an intermittent measurement periodicity in intermittent operation of the measurement unit, as a condition for changing the measurement condition, and the notification unit notifies the user of the intermittent measurement periodicity.

According to this aspect, in a case where the condition for the changing can be satisfied, the user can cause the measurement of the exercise to be started according to the condition for the changing.

In a preferable aspect, the measurement unit includes a GPS module which measures a positional information on the user, the measurement condition adjustment unit calculates the condition for the changing, which includes stopping of the GPS module, as a condition for changing the measurement condition, and the notification unit notifies the user of the condition for the changing, which includes the stopping of the GPS module.

Because power consumption by the GPS module is high, with the stopping of the GPS module, the time available for operation is easily set to be the measurement prediction time or longer. Furthermore, although the GPS module is not used, an acceleration sensor or a direction sensor is used, and thus with low power consumption, locating of the user is possible.

In a preferable aspect, in a case where, as a result of comparison, the time available for operation that is calculated based on the amount of remaining power of the battery is shorter than a remaining time that results from extracting a time that will have elapsed after the measurement of the exercise information is started, from the measurement prediction time, the measurement condition adjustment unit urges the user to change the measurement condition using the notification unit.

According to this aspect, after the training measurement is started, in a case where the amount of remaining power of the battery is used up and thus there is a likelihood that the measurement will be interrupted while in progress, the user can be urged to change the measurement condition and thus the interruption of the measurement while in progress can be avoided.

In a preferable aspect, in a case where, due to charging of the battery, the time available for operation that is calculated based on the amount of remaining power of the battery is longer than the measurement prediction time, the determination unit notifies the user using the notification unit.

According to this aspect, because the user is notified that necessary charging is completed, the user can know that it is possible that the measurement of the exercise is started.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described with reference to e drawings. However, a dimension and a scale of each unit in each drawing are set to be suitably different from an actual dimension and an actual scale, respectively. Furthermore, embodiments that will be described below are specific examples of the invention, and because of this, various limitations that are technically desirable are imposed. However, as long as the invention is not particularly described as being limited in the following description, the scope of the invention is not limited to the embodiments.

Embodiment

Figure 1:
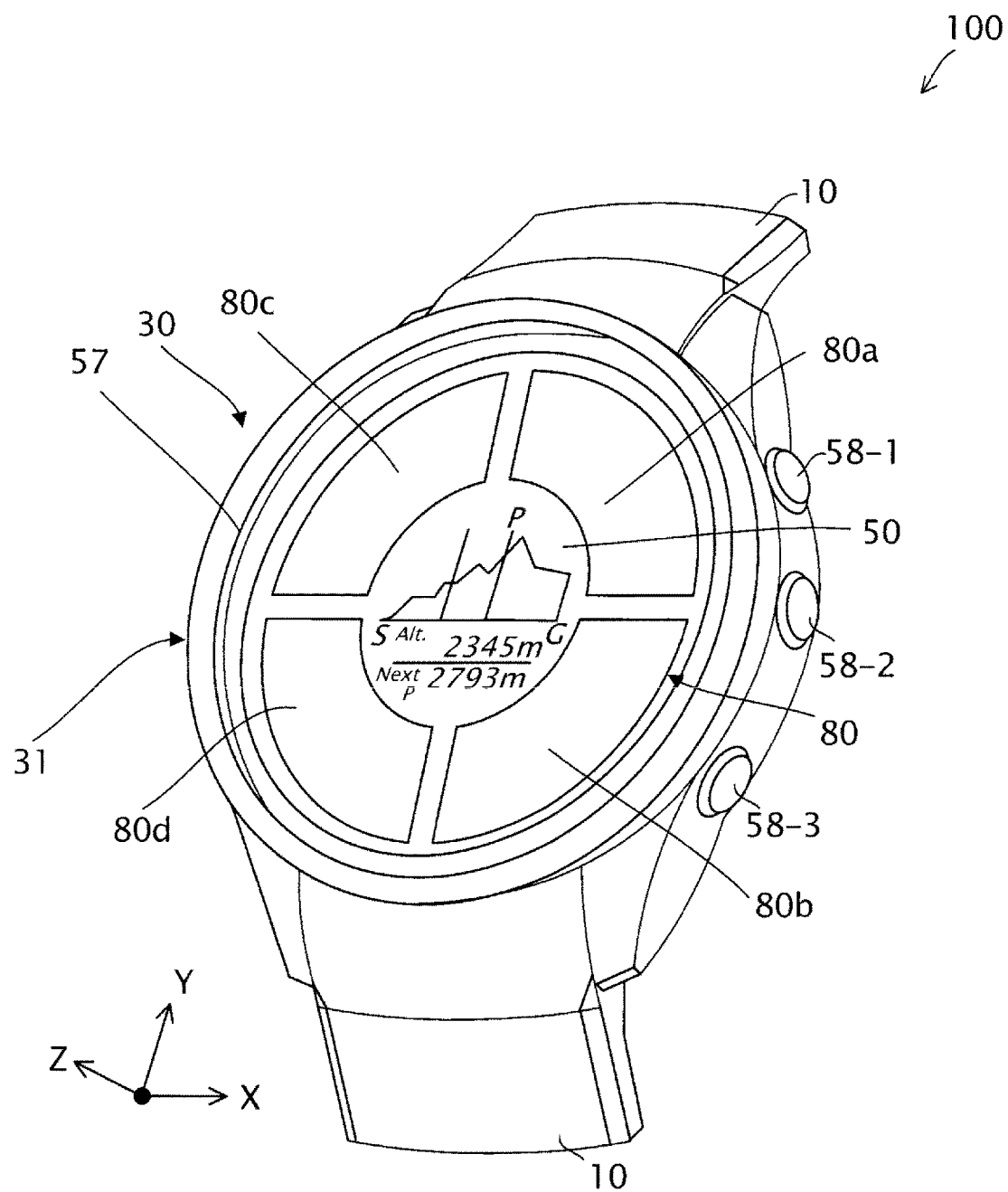
FIG. 1 is a perspective diagram of a portable electronic apparatus according to an embodiment of the invention, when viewed from the front surface side.
Figure 2:
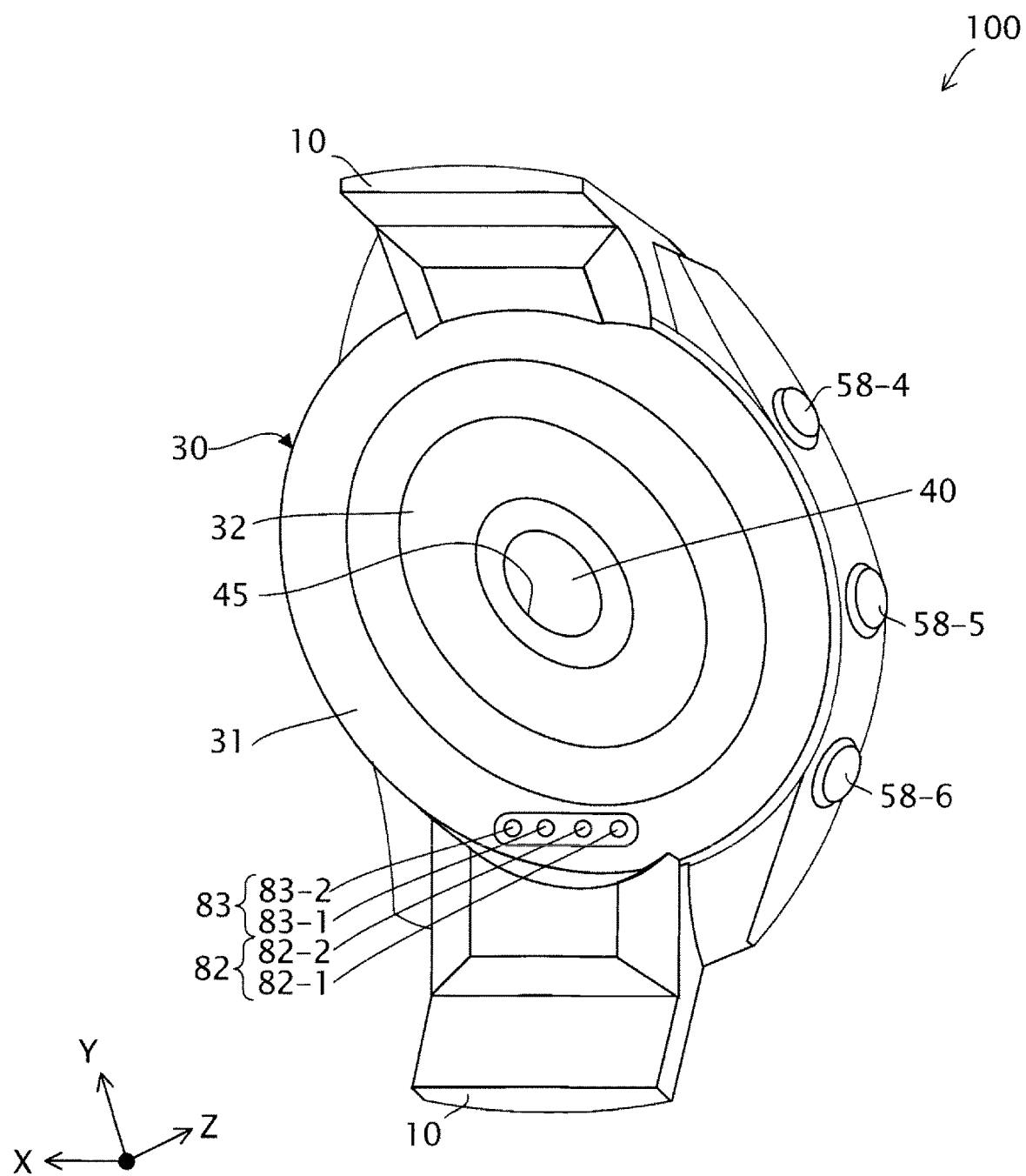
FIG. 2 is a perspective diagram of the portable electronic apparatus, when viewed from the rear surface side.

FIG. 1 is a perspective diagram of an external appearance of the portable electronic apparatus 100 according to an embodiment of the invention, when viewed from the front surface side. Furthermore, FIG. 2 is a perspective diagram of the external appearance of the portable electronic apparatus 100, when viewed from the rear surface side.

The portable electronic apparatus 100 is a device that is worn on a user's body, particularly a wrist device that is worn on a user's wrist. As illustrated in FIGS. 1 and 2, the portable electronic apparatus 100 has a band portion 10 and a device main-body 30, and has the same appearance as a wrist timepiece. The device main-body 30 includes a casing section 31, a display unit 50, a bezel 57, buttons 58-1 to 58-6, and a solar battery 80 that generates power using solar light. The solar battery 80 includes light receiving surfaces 80a, 80b, 80c, and 80d. At this point, the light receiving surfaces 80a, 80b, 80c, and 80d are surfaces of the solar battery 80 on which light is incident.

In this example, in a case where the display surface side of the display unit 50 is set to be a surface, a direction from a rear surface to a front surface is defined as a Z-axis positive direction, two axes that orthogonally intersect the Z-axis are defined as the X-axis and the Y-axis, respectively, and a direction from the center of a display surface of the display unit 50 to the button 58-2 is defined as the X-axis positive direction. In a state where the portable electronic apparatus 100 is worn on the user, the Z-axis positive direction is equivalent to a direction from the user to the casing section 31.

The band portion 10 is attached to the device main-body 30. The band portion 10 is a member necessary for the user to wear the device main-body 30. The casing section 31 is a casing of the portable electronic apparatus 100 that has an opening portion on the front surface side. The casing section 31, for example, can be formed of metal such as stainless steel, a resin, or the like.

The display unit 50 is engaged with an opening portion in the casing section 31 and displays an image. As the display unit 50, for example, a reflection type liquid crystal display or a display device that is manufactured using an electrophoretic deposition (EPD) can be employed. The bezel 57 is a component that protects and reinforces the display unit 50 and the casing section 31. The bezel 57 is positioned in such a manner as to surround an outer edge of the display unit 50.

The buttons 58-1 to 58-6 are pushed down on by the user to notify the portable electronic apparatus 100 of some instruction. The buttons 58-1 to 58-6 are collectively referred to as a button 58 in a case where they do not need to be distinguished. In a case where the button 58 is pushed down on, the portable electronic apparatus 100 changes an image that is displayed on the display unit 50. The solar battery 80 generates power based on energy of light such as light from the sun.

As illustrated in FIG. 2, an optical sensor unit 40, a communication terminal 82, and a charging terminal 83 are provided on the rear surface side of the device main-body 30. Furthermore, the casing section 31 has a projection portion 32 and a measuring window portion 45 that is positioned on a top of the projection portion 32.

The optical sensor unit 40 measures a pulse wave or the like using light. More specifically, the optical sensor unit 40 includes a light emitting section 42 (refer to FIG. 3), a light receiving section 41 (refer to FIG. 3), a band pass filter, and an AD converter. Light that is emitted from the light emitting section 42 reflects off a tissue of a human body such as a blood vessel and is incident on the light receiving section 41. The light receiving section 41 generates light that results from photoelectric conversion, more precisely, a pulse signal. The AD converter AD-converts a signal that is output from the light receiving section 41 and thus generates pulse signal data, and outputs the generated pulse signal data to a central processing unit (CPU) 21 (refer to FIG. 3). An amount of the light from the light emitting section 42, which is absorbed by hemoglobin or the like that is included in blood which flows through a blood vessel of a human body, changes in conjunction with a rhythm of a heart beat. Because of this, an amount of light that is incident on the light receiving section 41 depends on propagation of the rhythm of the heart beat, more precisely, a pulse. Based on the pulse signal data, the CPU 21 calculates a pulse rate, a pulse interval (R-R interval), a heart rate variability (HRV), or the like of the user. It is noted that the optical sensor unit 40 selects a wavelength of the light from the light emitting section 42 based on the same principle, and thus can measure at least one of blood pressure and blood oxygen concentration. The measuring window portion 45 has a hole for transmitting light that is emitted from the light emitting section 42, to the outside, and for introducing the light reflected off the tissue of the human body into the measuring window portion 45 itself.

The communication terminal 82 is a terminal that is brought into contact with a cradle (not illustrated), which is an external device, and that performs communication, when the portable electronic apparatus 100 performs communication with any other device. The communication terminal 82 is formed from the communication terminal 82-1 and the communication terminal 82-2. The charging terminal 83 is a terminal that is brought into contact with a cradle and is supplied with power, when the portable electronic apparatus 100 is charged. The charging terminal 83 is formed from a charging terminal 83-1 and a charging terminal 83-2.

Figure 3:
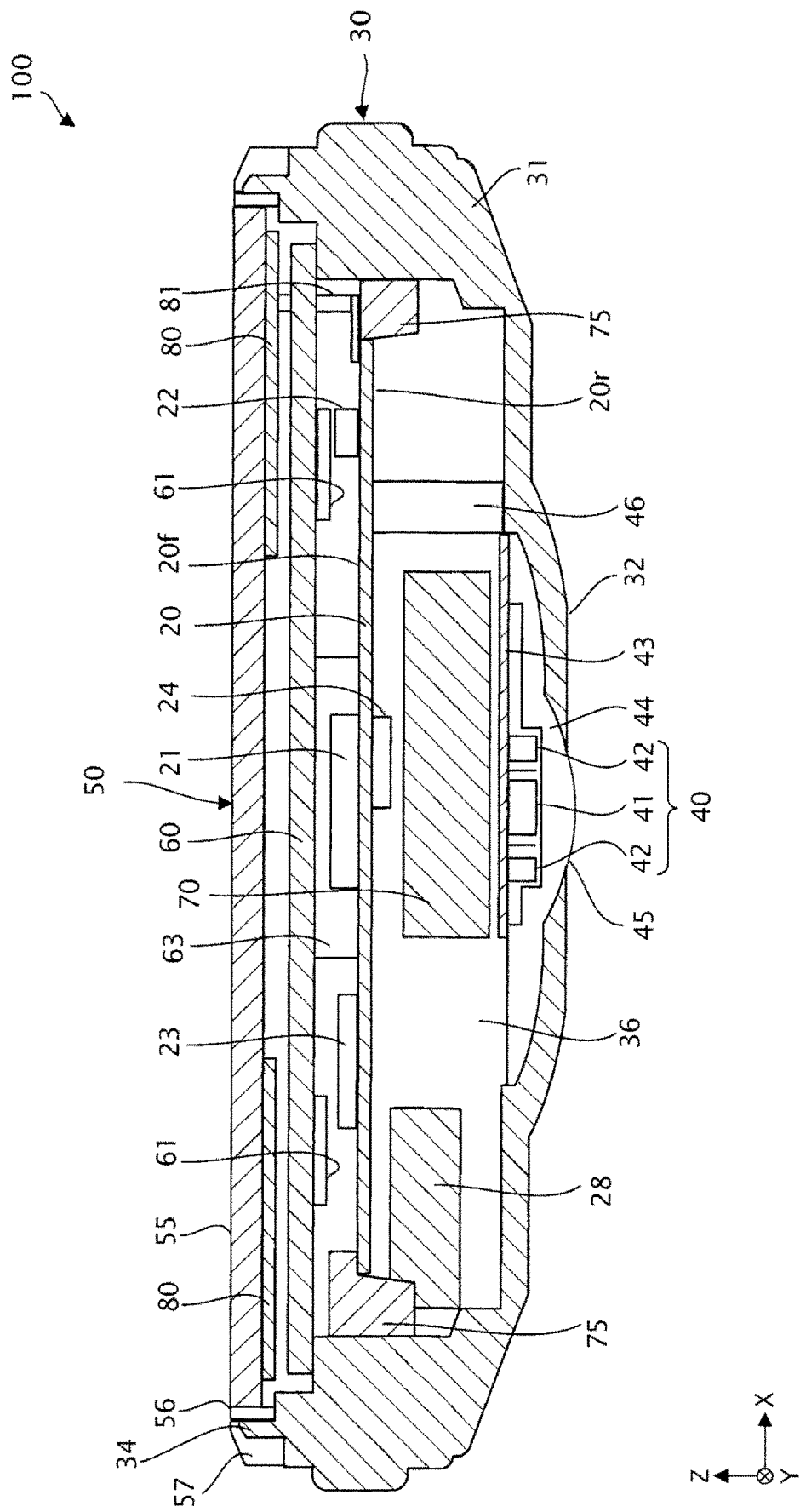
FIG. 3 is a cross-sectional diagram of the portable electronic apparatus.

FIG. 3 illustrates a cross section showing a configuration of the portable electronic apparatus 100. FIG. 3 is a cross-sectional diagram, illustrating the cross-section that appears when the portable electronic apparatus 100 is sliced down in an X-Z plane along the center line of the display surface of the display unit 50. In addition to a member and a device that are illustrated in FIGS. 1 and 2, the device main-body 30 of the portable electronic apparatus 100 that is illustrated in FIG. 3 has a circuit board 20, the CPU 21, a direction sensor 22, an acceleration sensor 23, and a global positioning system (GPS) module 28. Moreover, the device main-body 30 has a sensor board 43, a transparent cover 44, a connection wiring unit 46, a windshield plate 55, a joining member 56, a connection wiring unit 63, a secondary battery 70 (an electricity accumulation unit), a circuit casing unit 75, and a connection wiring unit 81. Furthermore, the casing section 31 has a protrusion portion 34 that protrudes in the upright position in the positive Z-axis direction toward an outer edge of an opening in the casing section 31. Furthermore, the optical sensor unit 40 has the light receiving section 41 and the light emitting section 42. Furthermore, the display unit 50 has a display panel 60 and a lighting unit 61. Then, an internal space 36, which is a closed space, is provided within the casing section 31 that surrounds the windshield plate 55 which the casing section 31 and the opening in the casing section 31.

The circuit board 20 includes a front surface 20f and a rear surface 20r that is opposite in direction to the front surface 20f, and an end portion thereof is attached by the circuit casing unit 75 into the casing section 31. The direction sensor 22, the acceleration sensor 23, the CPU 21, and the like are mounted on the front surface 20f of the circuit board 20, and any other circuit element 24 and the like are mounted on the rear surface 20r.

The direction sensor 22 measures magnetism in the vicinity of the portable electronic apparatus 100, and specifies an azimuth direction based on the measured magnetism. The acceleration sensor 23 measures acceleration in three axis directions, of the portable electronic apparatus 100. The GPS module 28 specifies a location of the portable electronic apparatus 100 using a satellite signal from a GPS satellite that is one of the positional information satellites.

In the optical sensor unit 40, the light emitting section 42 emits light to the tissue of the human body. The light receiving section 41 emits light to the tissue of the human body, and receives light that reflects off the tissue of the human body. As illustrated in FIG. 3, the portable electronic apparatus 100 has two light emitting sections 42. Then, the two light emitting sections 42 are arranged outside of the light receiving section 41. In this manner, the light receiving section 41 is positioned more inward than light emitting section 42, and thus external light that enters from the outer circumference side of the casing section 31 can be suppressed from entering the light receiving section 41 and an influence of the external light on the optical sensor unit 40 can be reduced.

The light receiving section 41 and the light emitting section 42 are arranged on the sensor board 43. The transparent cover 44 is a transparent member that suppresses introduction of a foreign material into the casing section 31 while transmitting the light that is emitted from the light emitting section 42, to the outside. For example, the transparent cover 44 is formed of photocurable resin. As illustrated in FIG. 3, the transparent cover 44 protrudes from the top of the projection portion 32 of the casing section 31.

The connection wiring unit 46 is electrical connected to the sensor board 43 and the circuit board 20. Regarding the circuit board 20, the connection wiring unit 46 is electrically connected to the rear surface 20r of the circuit board 20. The windshield plate 55 has a function of suppressing introduction of foreign material from the outside into the portable electronic apparatus 100 and of absorbing shock that is applied from the outside to the portable electronic apparatus 100. As a material of the windshield plate 55, glass, acrylic resin, polycarbonate, or the like can be used. The windshield plate 55 is positioned in such a manner as to cover the opening in the casing section 31, and is attached to the inner edge side of the protrusion portion 34 of the casing section 31.

The joining member 56 is a packing material, a bonding agent, or the like that is used to provide airtightness and liquid-tightness properties. The lighting unit 61 functions as a backlight of the display panel 60. The lighting unit 61 is connected to the front surface 20f of the circuit board 20. The lighting unit 61 is connected in this manner to the circuit board 20, and thus wire routing for connection can be minimized. Along with this, light that is emitted from the lighting unit 61 can be blocked by the circuit board 20, and an influence of stray light on the optical sensor unit 40 can be reduced.

The connection wiring unit 63 is electrically connected to the display panel 60 and the circuit board 20. Furthermore, the connection wiring unit 81 is electrically connected to the solar battery 80 and the circuit board 20. Regarding the circuit board 20, the connection wiring unit 46 and the connection wiring unit 81 are electrically connected to the front surface 20f of the circuit board 20. On the other hand, as described above, the optical sensor unit 40 is electrically connected to the rear surface 20r of the circuit board 20, which is a surface that is opposite in direction to the front surface 20f, via the connection wiring unit 46 that is configured with a flexible board or the like. With this arrangement, the wire routing for connection can be minimized. Along with this, stray light that derives from incident light for power generation, which becomes leakage light entering from the solar battery 80 side and then enters the casing, can be blocked by the circuit board 20, and thus an influence of external light on the optical sensor unit 40 can be reduced. The circuit casing unit 75 is a member that supports the circuit board 20.

It is possible that the secondary battery 70 supplies power to each device within the portable electronic apparatus 100. The power is converted into a given voltage, and so forth, and is supplied to each circuit. Thus, a circuit that drives the optical sensor unit 40 and measures a pulse, a circuit that drives the display panel 60, the CPU 21, and the like are driven. Charging of the secondary battery 70 is performed via one pair of charging terminals 83 that is conductively connected to the circuit board 20 by a conducting member (not illustrated) such as a power coil spring, or is performed using power that is generated by the solar battery 80. As the secondary battery 70, for example, a lithium-ion battery, a lithium polymer battery, or the like is employed. In the present embodiment, it is possible that a system 250 (refer to FIG. 4), which includes the CPU 21, the direction sensor 22, the acceleration sensor 23, the optical sensor unit 40, the display panel 60, and the like, operates at a voltage 2.8 V or higher. Furthermore, a maximum charging voltage of the secondary battery 70 is set to be 4.2 V.

Figure 4:
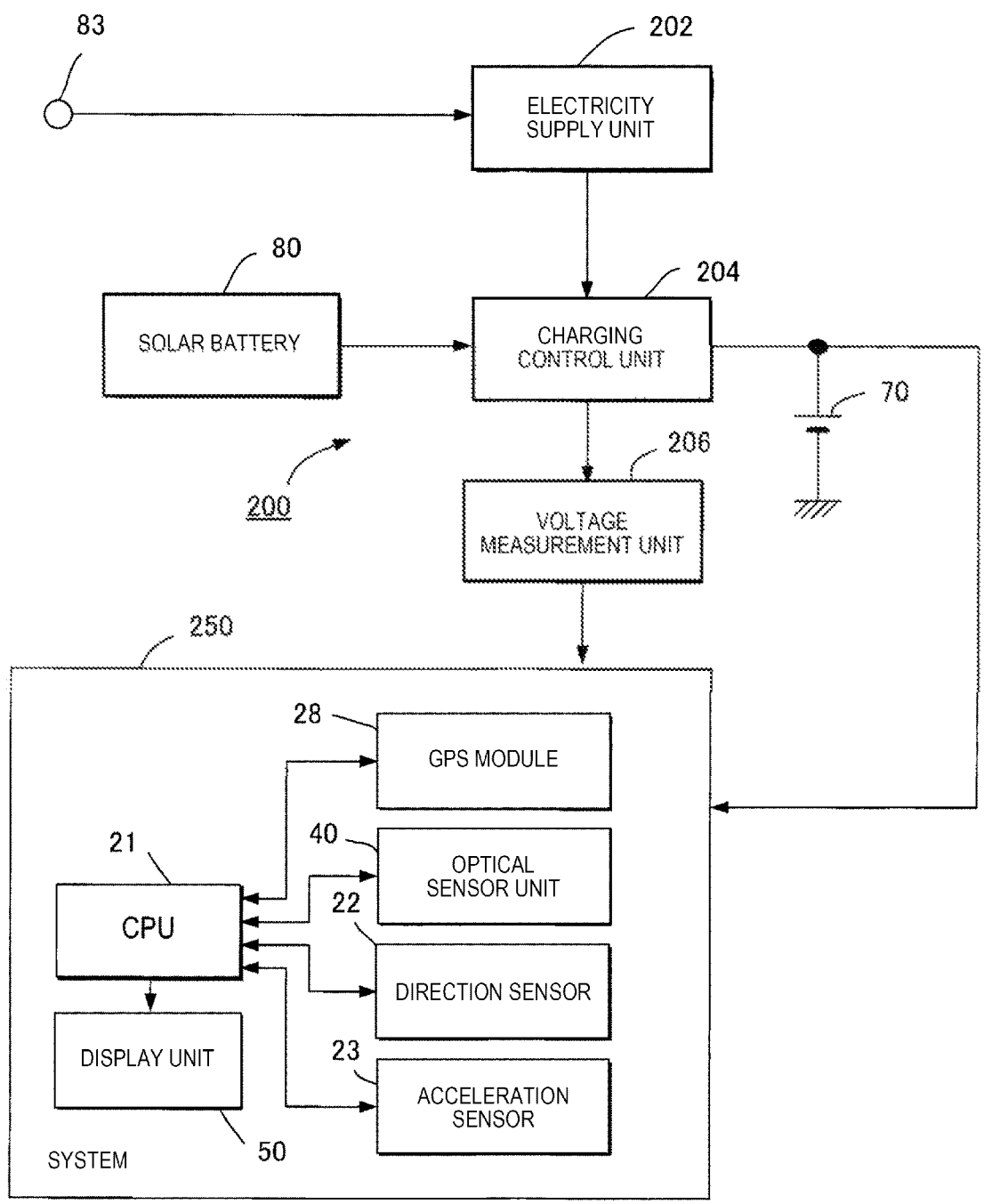
FIG. 4 is a circuit diagram illustrating a configuration of an electric circuit of the portable electronic apparatus.

FIG. 4 is a block diagram illustrating configuration of an electric circuit of the portable electronic apparatus 100. In FIG. 4, the system 250 is means that plays a role in causing the portable electronic apparatus 100 to function as a training support apparatus, and includes the CPU 21, the GPS module 28, the optical sensor unit 40, the direction sensor 22, the acceleration sensor 23, and the display unit 50.

The CPU 21 according to the present embodiment calculates an amount of remaining power of the secondary battery 70, and calculates a measurement prediction time from starting of training measurement to ending and a time available for operation for which operation is possible using the amount of remaining power of the battery. In a case where the measurement prediction time is longer than the time available for operation, the CPU 21 functions as a processor that notifies the user before the training measurement is started.

Moreover, in more detail, the CPU 21 measures biological information on the user, specifically pulse wave data, using the optical sensor unit 40. Furthermore, the CPU 21 locates the user using the GPS module 28. In addition to the locating using the GPS module 28, it is also possible that the CPU 21 performs the locating that uses the direction sensor 22 and the acceleration sensor 23. The CPU 21 has a training measurement function in which, while the user who wears the Portable electronic apparatus 100 performs training, measuring of the biological information that uses the optical sensor unit 40 and recording of a result of the measurement are performed and additionally, the locating that uses the GPS module 28 or a set of the direction sensor 22 and the acceleration sensor 23 and recording of a result of the locating are performed.

Furthermore, the CPU 21 has a function in which the measurement prediction time for which the training measurement is continued is obtained in advance before the training measurement is started, in which it can be determined whether or not the portable electronic apparatus 100 can be caused to operate on a current amount of remaining power of the battery for the measurement prediction time or longer, and in which, in a case where a result of the determination is negative, a notification to that effect is provided to the user before the training measurement is started, that is, before the user starts to take exercise. It is noted that this function will be described in detail below.

A power supply unit 200 is a circuit that supplies power for causing the system 260 to operate. The power supply unit 200 has the solar battery 80, an electricity supply unit 202, a charging control unit 204, the secondary battery 70, and a voltage measurement circuit 206.

The electricity supply unit 202 is a circuit that is supplied with power by an external power source, such as a cradle, that s connected to the charging terminal 83, and thus generates charging power of the secondary battery 70. In a case where a voltage is supplied from the electricity supply unit 202, the charging control unit 204 charges the secondary battery 70 with the voltage from the electricity supply unit 202. Furthermore, in a case where the voltage is not supplied from the electricity supply unit 202 and where a voltage is supplied from the solar battery 80, the charging control unit 204 charges the secondary battery 70 with the voltage from the solar battery 80. Furthermore, in a case where an instruction for measuring an amount of generated power is provided by the CPU 21, the charging control unit 204 opens a charging path from the solar battery 80 to the secondary battery 70, and supplies an open circuit voltage of the solar battery 80 to the voltage measurement circuit 206. As a result, the open circuit voltage indicating an amount of power generated by the solar battery 80 is measured by the voltage measurement circuit 206. Furthermore, in a case where an instruction for measuring the amount of remaining power of the battery is provided by the CPU 21, the charging control unit 204 supplies the charging power of the secondary battery 70 to the voltage measurement circuit 206. As a result, a charge voltage indicating the amount of remaining power of the secondary battery 70 is measured by the voltage measurement circuit 206. It is noted that a unit of the amount of remaining power of the battery is an amount of power. Generally, the larger the amount of remaining power of the battery, the higher the charging voltage. Therefore, the amount of remaining power of the battery can be specified.

Figure 5:
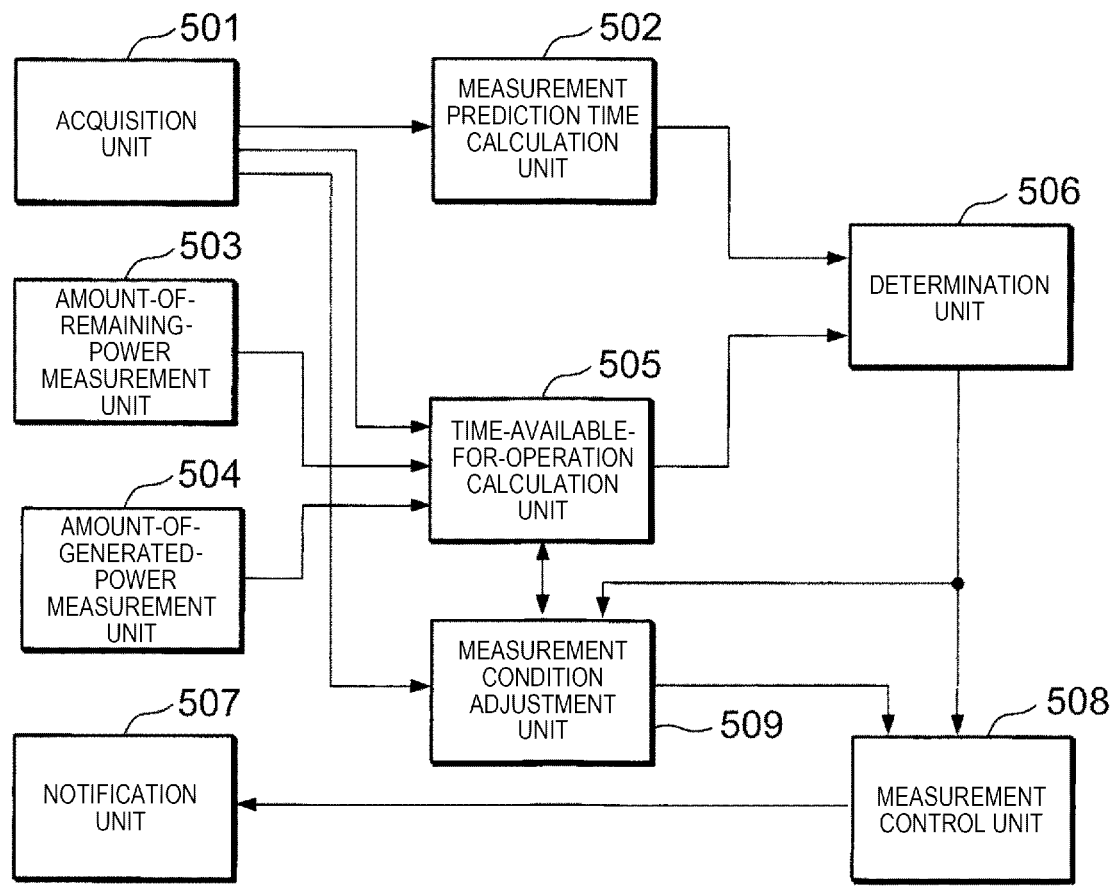
FIG. 5 is a block diagram illustrating a functional configuration of a training support program that is executed by a CPU of the portable electronic apparatus.

FIG. 5 is a block diagram illustrating a functional configuration of a training support program that is executed by the CPU 21. A processor that is the CPU 21 executes the training support program that is stored in a memory which is not illustrated, and thus functions as an acquisition unit 501, a measurement prediction time calculation unit 502, an amount-of-remaining-power measurement unit 503, an amount-of-generated-power measurement unit 504, a time-available-for-operation calculation unit 505, a determination unit 506, a notification unit 507, a measurement control unit 508, and a measurement condition adjustment unit 509.

By detecting an operation on the button 58, the acquisition unit 501 is means that acquires various pieces of information from the user. Examples of the acquisition unit 501 include information relating to the exercise that is taken by the user, that is, information relating to training, and information relating to a measurement condition. The notification unit 507 is means that notifies the user of various pieces of information using the display unit 50.

The measurement prediction time calculation unit 502 is means that calculates a time from starting of the training selected by the user to ending, that is, the measurement prediction time for which the training measurement is continued. The measurement prediction time is equivalent to second information indicating a time required to measure the selected training, and the measurement prediction time calculation unit 502 functions as a second information generation unit that generates the second information.

The amount-of-remaining-power measurement unit 503 is means that causes the voltage measurement circuit 206 to measure the charging voltage of the secondary battery 70 and measures the amount of remaining power of the secondary battery 70 based on the measurement result. The amount-of-generated-power measurement unit 504 is means that causes the voltage measurement circuit 206 to measure the open circuit voltage of the solar battery 80, and measures the amount of power generated by the solar battery 80.

The time-available-for-operation calculation unit 505 is means that calculates the time available for operation for which the portable electronic apparatus 100 can be caused to continue to operate on the current amount of remaining power under various measurement conditions. The time available for operation is equivalent to first information indicating the time for which the operation is possibly continued, and the time-available-for-operation calculation unit 505 functions as a first information generation unit that generates the first information. Furthermore, the time-available-for-operation calculation unit 505 has a function in which the time available for operation is corrected based on the amount of power generated by the solar battery 80, which is measured by the amount-of-generated-power measurement unit 504.

The determination unit 506 is means that compares the time available for operation, which is calculated by the time-available-for-operation calculation unit 505, and the measurement prediction time, which is calculated by the measurement prediction time calculation unit 502, and thus determines whether or not the portable electronic apparatus 100 can be caused to operate on the current amount of remaining power of the battery for the measurement prediction time or longer and, in a case where a result of the determination is negative, provides a notification to that effect using the notification unit 507, before the starting of the training measurement. As described above, the time available for operation is equivalent to the first information, and the measurement prediction time is equivalent to the second information. Because of this, the determination unit 506 compares the first information and the second information.

In the present embodiment, the CPS module 28, the optical sensor unit 40, the direction sensor 22, and the acceleration sensor 23 function as measurement units that measure the exercise that is taken by the user, and generates exercise information. The measurement control unit 508 is means that performs control of the measurement of the exercise using the measurement unit in accordance with the set measurement condition.

The measurement condition adjustment unit 509 is means that proposes a condition for changing a measurement condition and adjusts the measurement condition that is set for the measurement control unit 508, in a case where the time available for operation, which is calculated by the time-available-for-operation calculation unit 505, is shorter than the measurement prediction time, which is calculated by the measurement prediction time calculation unit 502.

Figure 6:
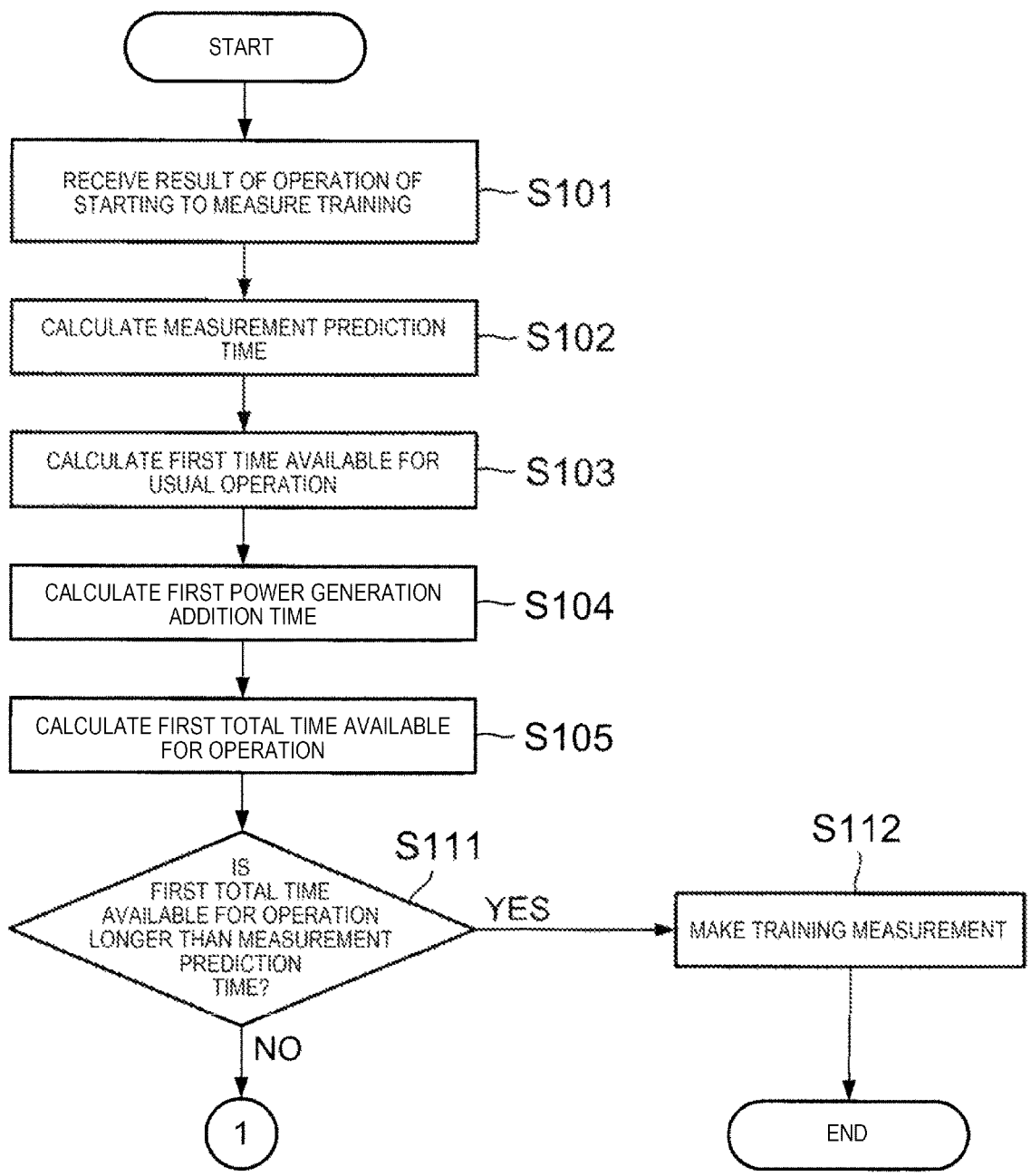
FIG. 6 is a flowchart illustrating the detail of processing by the training support program.
Figure 7:
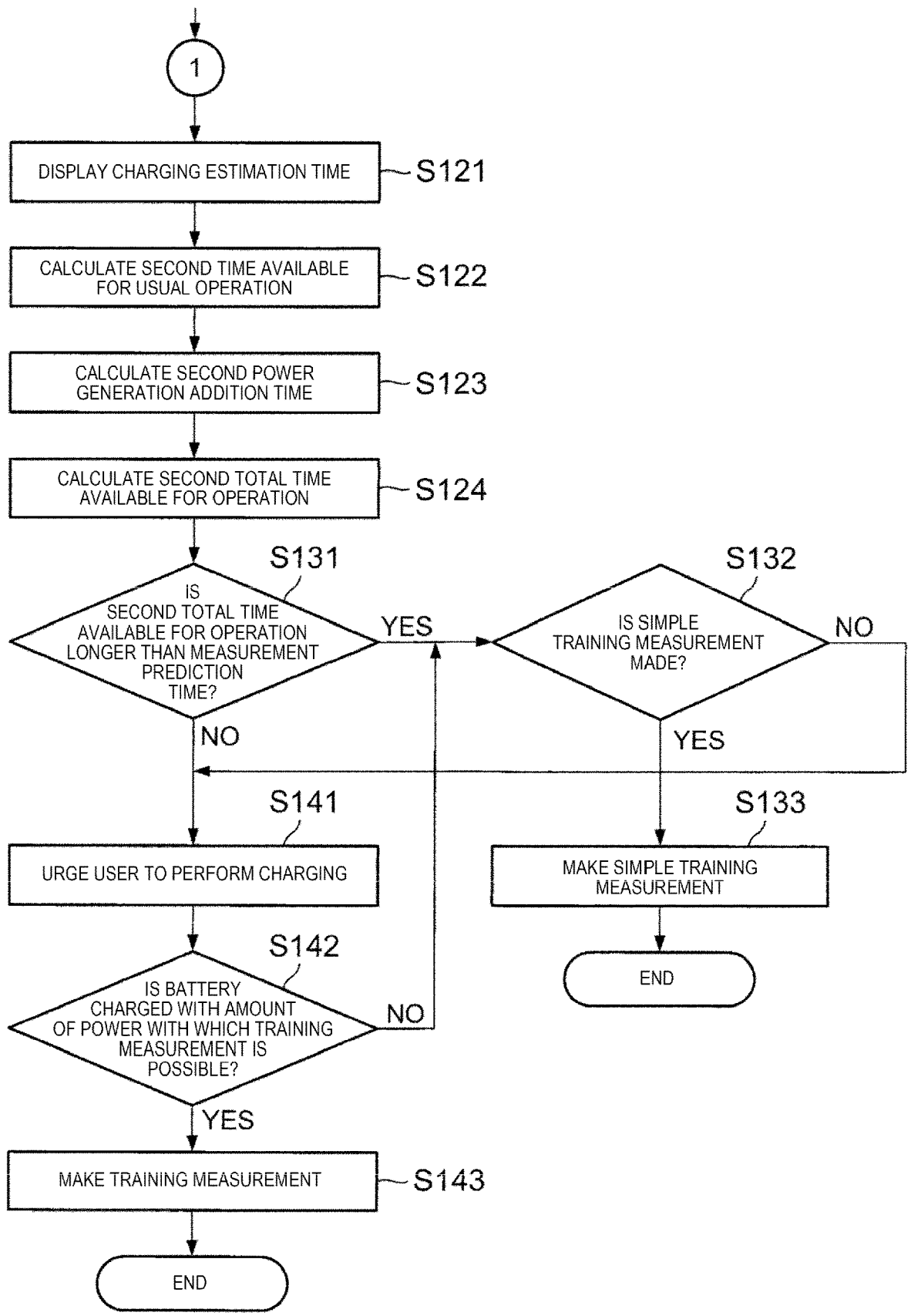
FIG. 7 is a flowchart illustrating the detail of the processing by the training support program.

FIGS. 6 and 7 are flowcharts illustrating details of processing by the training support program according to the present embodiment. An operation according to the present embodiment will be described below with reference to FIGS. 6 and 7.

Before starting the training, the user provides an instruction for executing the training support program by performing the operation on the button 58. Accordingly, the CPU 21 starts to execute the training support program.

First, the acquisition unit 501 recognizes an operation of starting to measure the training (S101). Specifically, the notification unit 507 displays a menu for training on the display unit 50. At this point, the training that is displayed a menu format on the display unit 50, for example, is associated with pieces of information, such as a training course and a traveling distance. Then, the user selects desired training by performing the operation on the button 58. The acquisition unit 501 detects training that is selected by the user, based on the operation on the button 58.

Next, based on the information relating to the training, which acquired by the acquisition unit 501, the measurement prediction time calculation unit 502 calculates the measurement prediction time, that is, the time that it takes to end the training after starting the training (S102). In the present embodiment, the measurement prediction time calculation unit 502 calculates the measurement prediction time from a training distance that is specified by the information relating to the training and a training effect. At this point, the training effect is calculated based on the biological information on the user or a physical length level such as a maximum amount of inhaled oxygen. The maximum amount of inhaled oxygen is an index of endurance that is based on a cardio-pulmonary function, and is possibly calculated from the biological information on the user, such as pulse wave information or heartbeat information, that was recently measured by the optical sensor unit 40, and on load information. It is noted that the measurement prediction time calculation unit 502 may measure the measurement prediction time from the training distance and the maximum amount of inhaled oxygen. Furthermore, the measurement prediction time may be a training time that is selected by the user performing the operation on the button 58.

Next, the time-available-for-operation calculation unit 505 instructs the charging control unit 204 to measure the amount of remaining power, and causes the amount-of-remaining-power measurement unit 503 to measure the amount of remaining power of the secondary battery 70. Based on a result of the measurement, the time-available-for-operation calculation unit 505 calculates a first time available for usual operation (S103). The first time available for usual operation is a time for which the portable electronic apparatus 100 possibly continues to operate on the amount of remaining power of the secondary battery 70 in a case where the training is measured under a measurement condition of the largest power consumption. The measurement condition of the largest power consumption, for example, is a measurement condition What the locating that uses the GPS module 28 or the measuring of the biological information that uses the optical sensor unit 40 is performed every second. An operating state of the portable electronic apparatus 100 under this measurement condition referred to as a full-capacity operation for convenience.

Next, the time-available-for-operation calculation unit 505 instructs the charging control unit 204 to measure an amount of generated power, causes the amount-of-generated-power measurement unit 504 to measure the amount of power generated by the solar battery 80, and calculates first power generation addition time (S104) based on a result of the measurement. The first power generation addition time is an amount of time by which the time for which the portable electronic apparatus 100 possibly operates, which increases according to generation of power by the solar battery 80, is increased.

As methods of calculating the first power generation addition time, various methods are considered, but in the present embodiment, the first power generation addition time is calculated as follows. First, an amount of power per unit hour, with which the solar battery 80 charges the secondary battery 70, is obtained based on the open circuit voltage of the solar battery 80. Next, the amount of power per unit hour is multiplied by the first time available for usual operation, and thus an amount of power with which the solar battery 80 charges the secondary battery 70 within the first time available for usual operation is obtained. Then, the amount of power is divided by power that is consumed by the portable electronic apparatus 100 in a full-capacity operating state, and thus the first power generation addition time is calculated.

Next, the time-available-for-operation calculation unit 505 adds up the first time available for usual operation, which is calculated in S103, and the first power generation addition time, which is calculated in S104, and thus calculates first total time available for operation (S105). In this manner, the time-available-for-operation calculation unit 505 replaces the first time available for usual operation with the first total time available for operation, based on the amount of power generated by the solar battery 80.

Next, the determination unit 506 determines whether or not the first total time available for operation, which is calculated in S105, is longer than the measurement prediction time, which is calculated in S102 (S111). In a case where a result of the determination in S111 is "YES", the measurement control unit 508 starts control that causes the portable electronic apparatus 100 to measure the training in the full-capacity operation (S112).

On the other hand, in a case where the result of the determination in S111 is "NO", each of the modules, such as the time-available-for-operation calculation unit 505, the determination unit 506, and the like operates thereafter under the control of the measurement condition adjustment unit 509.

First, the determination unit 506 calculates a charging time necessary to charge the secondary battery 70 with an amount of power that corresponds to a difference between a predicted amount of consumption power within the measurement prediction time and the amount of remaining power of the battery, and displays a result of the calculation, as a charging estimation time, on the display unit 50, using the notification unit 507 (S121). At this point, the power that is consumed by the portable electronic apparatus 100 at the full-capacity state is multiplied by the measurement prediction time, and thus the predicted amount of consumption power can be calculated. Then, it is possible that an amount of power that corresponds to a difference between the predicted amount of consumption power and the amount of remaining power of the secondary battery 70 is divided by the amount of power generated by the solar battery 80, and thus the charging estimation time is calculated.

Next, the time-available-for-operation calculation unit 505 instructs the charging control unit 204 to measure the amount of remaining power, and causes the amount-of-remaining-power measurement unit 503 to measure the amount of remaining power of the secondary battery 70. Based on the result of the measurement, the time-available-for-operation calculation unit 505 calculates a second time available for usual operation (S122). The second time available for usual operation is a time for which the portable electronic apparatus 100 possibly continues to operate on the amount of remaining power of the secondary battery 70 in a case where the training is measured under a measurement condition of power consumption that is lower than the full-capacity operation. An operating state of the portable electronic apparatus 100 under this measurement condition is referred to as an ecological operation for convenience. The measurement condition in the ecological operation, for example, is a measurement condition that the GPS module 28 is stopped and that the locating which instead uses the direction sensor 22 and the acceleration sensor 23 is performed. Alternatively, the measurement condition in the ecological operation is a measurement condition that, in a case where the locating that causes the direction sensor 22 and the acceleration sensor 23 to operate intermittently is performed or where the measuring of the biological information that causes the optical sensor unit 40 to operate intermittently is performed, a periodicity of the intermittent operation is set to be longer than in the full-capacity operation.

Next, the time-available-for-operation calculation unit 505 instructs the charging control unit 204 to measure the amount of generated power, causes the amount-of-generated-power measurement unit 504 to measure the amount of power generated by the solar battery 80, and calculates second power generation addition time based on a result of the measurement (S123). The second power generation addition time is an amount of time by which the time for which the portable electronic apparatus 100 possibly operates, which increases according to the generation of power by the solar battery 80, is increased in an ecological operation state.

The second power generation addition time, for example, is calculated as follows. Next, the amount of power per unit hour, which is generated by the solar battery 80, is multiplied by the second time available for usual operation, and thus the amount of power with which the solar battery 80 charges the secondary battery 70 within the second time available for usual operation is obtained. The amount of power is divided by power that is consumed by the portable electronic apparatus 100 in the ecological operation state, and thus the second power generation addition time is calculated.

Next, the time-available-for-operation calculation unit 505 adds up the second time available for usual operation, which is calculated in S122, and the second power generation addition time, which is calculated in S123, and thus calculates second total time available for operation (S124). In this manner, the time-available-for-operation calculation unit 505 replaces the second time available for usual operation with the second total time available for operation, based on the amount of power generated by the solar battery 80.

Next, the determination unit 506 determines whether or not the second total time available for operation, which is calculated in S124, is longer than the measurement prediction time, which is calculated in S102 (S131).

In a case where a result of the determination in S131 "YES", is the measurement condition adjustment unit 509 displays a message that urges the user to select whether or not to make a simple training measurement, on the display unit 50, using the notification unit 507 (S132). At this point, the simple training measurement is to measure the training under the measurement condition in the ecological operation described above. In S132, the measurement condition adjustment unit 509, for example, stops a GPS module 29, sets an intermittent measurement periodicity to be long, or the like, and thus displays a measurement condition in the ecological operation state on the display unit 50, using the notification unit 507 and obtains user's consent.

When the user selects the simple training measurement by performing the operation on the button 58, the result of the determination in S132 is "YES". In this case, the measurement condition adjustment unit 509 instructs the measurement control unit 508 to make the simple training measurement, and the measurement control unit 508 starts control that measures the training under a measurement condition that corresponds to the ecological operation (S133).

On the other hand, in a case where the user does not select the simple training measurement, the result of the determination in S132 is "NO". In this case, the measurement condition adjustment unit 509 displays a message that urges the user to perform the charging, on the display unit 50, using the notification unit 507, and waits a given time (S141).

Next, the determination unit 506 determines whether or not the secondary battery 70 has come to be charged with an amount of power with which the training measurement is possible in the full-capacity operation (S142). Specifically, the time-available-for-operation calculation unit 505 measures the amount of remaining power of the secondary battery 70 and the amount of power generated by the solar battery 80 and recalculates the first total time available for operation by performing the same processing in S103 to S105. Furthermore, the determination unit 506 determines whether or not the first total time available for operation exceeds the measurement prediction time.

In a case where the result of the determination in S142 is "YES", the measurement condition adjustment unit 509 causes the measurement control unit 508 to start to measure the training in the full-capacity operation (S143). More specifically, the measurement condition adjustment unit 509 causes the notification unit 507 to alert the user to a message indicating that charging with an amount of necessary power is completed, and, when the acquisition unit 501 is instructed by the user to start to measure the training in the full-capacity operation, causes the measurement control unit 508 to start control of the training measurement under a measurement condition in the full-capacity operation.

On the other hand, in a case where the result of the determination in S142 is "NO", processing by the measurement condition adjustment unit 509 proceeds to S132. Then, while the user does not select the simple training, the processing is repeated in this order: S132, S141, S142, and S132.

In the meantime, the user may charge the secondary battery 70 by charging the solar battery 80, but if an external power source is connected to the charging terminal 83, for a shorter time, the user can cause the secondary battery 70 to be charged with an amount of power with which the training measurement is possible in the full-capacity operation.

Then, when the secondary battery 70 has come to be charged with the amount of power with which the training measurement is possible in the full-capacity operation, the result of the determination in S142 is "YES" and the training measurement is started in the full-capacity operation (S143).

As described above, according to the present embodiment, case where the training measurement for which the training that is selected by the user is measured is longer than the time available for opera which the operation on the current amount of remaining power of the battery can be continued, the user is notified before starting the training. Therefore, the amount of remaining power is used up, and thus the training measurement can be prevented from being interrupted while in progress. Furthermore, according to the present embodiment, because the time available for operation is corrected based on the amount of power generated by the solar battery 80, the time available for operation can be exactly obtained. Furthermore, according to the present embodiment, in a case where the amount of remaining power of the battery falls short of the predicted amount of consumption power within the measurement prediction time, the user is notified of a charging time necessary for charging the secondary battery 70 with the amount of power that corresponds to the difference, which is a shortage of power. Therefore, the user easily determines a corrective action that has to be taken by the user himself/herself, such as the charging of the secondary battery 70. Furthermore, according to the present embodiment, it is possible that the training measurement condition can be adjusted. Because of this, with the adjustment of the measurement condition, the time available for operation is set to be the measurement prediction time or longer and a situation where the amount of remaining power of the battery is used up while the training measurement is in progress is avoided, Thus, it is possible that the training measurement is started. Furthermore, according to the present embodiment, the condition for changing the measurement condition, under which the time available for operation can be set to be the measurement prediction time or longer, for example, the condition for changing the periodicity of the measurement that is intermittently performed appears to the user. Because of this, in a case where the condition for changing the measurement condition can be satisfied, the training measurement can be started according to the condition for changing the measurement condition. Furthermore, according to the present embodiment, in a case where, due to charging of the secondary battery 70, the time available for operation for which the operation on the amount of remaining power of the secondary battery is possibly continued is longer than the measurement prediction time, the user is notified that necessary charging is completed. Therefore, the user can know that the training measurement is started.

Other Embodiments

The embodiment of the invention is described above, but, for example, other embodiments of the invention are considered as follows.

(1) In the embodiment described above, in the case where the measurement cannot be made in the full-capacity operation for the measurement prediction time, the measurement condition adjustment unit 509 proposes the measurement in the ecological operation to the user. However, instead of doing this, the measurement condition adjustment unit 509 may propose multiple types of measurement conditions under which the measurement is possibly continued on the current amount of remaining power over the measurement prediction time and the user may be allowed to select a desired measurement condition. For example, if the measurement is made intermittently with a periodicity of three or more seconds, in a case where the measurement is possibly continued on the current amount of remaining power of the battery over the measurement prediction time, a mode is considered in which intermittent measurements are proposed such as measurements with a periodicity of three seconds, a periodicity of five seconds, and a periodicity of ten seconds. In that case, of the measurement condition, a recommended one may be displayed in an identifiable manner. As a method of determining the recommended measurement condition, various methods are considered, but for example, pieces of information relating to a measurement method that is selected by the user are collected using questionnaires and a measurement condition that is selected by many users may be set to be a recommended measurement condition.

(2) In the embodiment described above, the measurement condition adjustment unit 509 may calculate a measurement condition under which the time available for operation for which the measurement of an exercise is possibly continued using the amount of remaining power of the battery is set to be the same as the measurement prediction time, and may propose the calculated measurement condition to the user. For example, in a case where the adjustment of the periodicity with which the measurement is made intermittently is possible, a mode is considered in which the measurement condition adjustment unit 509 calculates a periodicity with which the time available for operation for which the measurement of the exercise is possibly continued using the current amount of remaining power of the battery is the same as the measurement prediction time and proposes the calculated periodicity to the user. It noted that the proposal relating to a measurement condition under which time available for operation is the same as the measurement prediction time is not limited to the condition for changing an intermittent measurement periodicity. For example, in a case where, with the stopping of the GPS module or change condition that results from combining the stopping of the GPS module and the changing of an intermittent prediction periodicity, the time available for operation can be the same as the measurement prediction time, such a change condition may be proposed to the user.

(3) In the embodiment described above, in some cases, after the training measurement is started, for example, there can be a likelihood that a situation will occur where the power consumption by the portable electronic apparatus 100 increases temporarily or the training measurement will be interrupted while in progress due to a decrease in the amount of power generated by the solar battery 80, or the like. Accordingly, in a case where the measurement condition adjustment unit 509 causes the time-available-for-operation calculation unit 505 to repeatedly calculate the time available for operation for which the portable electronic apparatus 100 is possibly caused to operate on the current amount of remaining power of the battery, and where the time available for operation is shorter than a remaining time that results from subtracting a time that will have elapsed after the training is started from the measurement prediction time, the notification unit 507 may urge the user to change the measurement condition. In this mode, after the training measurement is started, in a case where the amount of remaining power of the battery is used up and thus there is a likelihood that the measurement will be interrupted while in progress, the user can be urged to change the measurement condition and thus the interruption of the measurement while in progress can be avoided.

(4) In the embodiment described above, in a case where power is not supplied from an external power source, with the generation of power by the solar battery 80, the charging control unit charges the secondary battery 70, but the charging control unit may be configured in such a manner that the charging of the secondary battery 70, which is based on supply of electricity from the external power source, and the charging of the secondary battery 70 due to the generation of power by the solar battery 80, are performed at the same time. For example, a configuration is considered in which a first constant current circuit that outputs constant current due to the supply of electricity from the external power source, and a second constant current circuit that outputs constant current due to the generation of power by the solar battery 80 are provided and in which constant current, which results from adding up the constant current that is output by the first constant current circuit and the constant current that is output by the second constant current circuit, flows into the secondary battery 70.

(5) In the embodiment described above, the time-available-for-operation calculation unit 505 is provided that, as the first information generation unit which generates the first information, calculates the time available for operation for which the operation on the amount of remaining power of the secondary battery is possible continued. Furthermore, in the embodiment described above, the measurement prediction time calculation unit 502 is provided that, as the second information generation unit which generates the second information, outputs the measurement prediction time for which a selected exercise is measured.

However, the first information generation unit and the second information generation unit are not limited to this. For example, the first information generation unit may generate the amount of remaining power of the secondary battery, as the first information. Furthermore, the second information generation unit may generate the predicted amount of consumption power based on the measurement prediction time for which the selected exercise is measured, as the second information. In a case where the portable electronic apparatus 100 operates only for the measurement prediction time, the predicted amount of consumption power is an amount of power that is consumed by the portable electronic apparatus 100. More specifically, the second information generation unit may multiply the power consumed by the portable electronic apparatus 100 and the measurement prediction time, and thus may calculate the predicted amount of consumption power.

Furthermore, in a case where the portable electronic apparatus 100 includes a solar battery that generates power using solar light, the first information generation unit may specify as the first information a predicted amount of power to be generated by the solar battery, based on the measurement prediction time, and may generate an amount of power that results from adding the predicted amount of power to be generated by the solar battery to the amount of remaining power of the secondary battery. Furthermore, the determination unit 506 may calculate time of charge necessary to charge the secondary battery based on the amount of power that corresponds to a difference between the predicted amount of consumption power within the measurement prediction time and the amount of remaining power of the battery, and the notification unit 507 may give notification of this charging time. With these modes, the same effect as in the embodiments described above is obtained.

(6) In the embodiment described above, power is generated by the solar battery 80, but is not limited to this. For example, the portable electronic apparatus 100 may have at least one of the solar battery 80, a thermoelectric element (a power generation mechanism) that converts thermal energy into power energy, and a vibration power generation element (the power generation mechanism) that performs conversion into power using pressure that occurs on a vibration surface due to vibration.

(7) In the embodiment described above, the GPS module 28 performs various processing operations using a satellite signal from a GPS satellite, but may use a satellite signal from a positioning satellite for Global Navigation Satellite System (GNSS) or a positioning satellite other than GNSS, as a positional information satellite other than the GPS satellite. For example, the portable electronic apparatus 100 may use satellite signals from satellites for one or multiple systems, among Wide Area Augmentation System (WAAS), European Geostationary-Satellite Navigation Overlay Service (EGNOS), Quasi Zenith Satellite System (QZSS) Global Navigation Satellite System (GLONASS), GALILEO, and BeiDou Navigation Satellite System (BeiDou).

(8) In the embodiment described above, the portable electronic apparatus 100 is a wrist apparatus that is included in apparatuses that the user wears on his/her own body, but is not limited to this. For example, the portable electronic apparatus 100 may be a Head Mounted Display (HMD) that is worn on the user's head.

(9) In the embodiment described above, the secondary battery 70 is used, but instead of the secondary battery, a primary battery may be used. That is, according to the invention, batteries include the secondary battery and the primary battery.

What is claimed is:

1. A portable electronic apparatus comprising:
   an operation button that receives an operation of a user to select a menu for a training;
   a measurement unit that measures exercise information of the user during the training by a sensor;
   a battery that supplies power to the measurement unit;
   a processor that measures an amount of remaining power of the battery, calculates a predicted amount of consumption power consumed from start to end of the training based on the menu selected by the user and based on biological information on the user measured using the sensor or a physical length level on the user, and compares the amount of remaining power of the battery and the predicted amount of consumption power; and
   a notification unit that notifies the user before the start of the training, when the processor determines that the predicted amount of consumption power is larger than the amount of remaining power of the battery.

2. The portable electronic apparatus according to claim 1, wherein the menu for the training includes a measurement prediction time corresponds to a measurement period from the start to the end of the training.

3. The portable electronic apparatus according to claim 2, further comprising:
   a solar battery that supplies generated power to the battery,
   wherein the processor calculates a predicted amount of power to be generated by the solar battery during the measurement period, and
   wherein the notification unit notifies the user before the start of the training, when the processor determines that the predicted amount of consumption power is larger than a value of a sum of the amount of remaining power of the battery and the predicted amount of power to be generated.

4. The portable electronic apparatus according to claim 1, wherein the processor calculates a charging time necessary to charge the battery in order for the amount of remaining power of the battery to be the predicted amount of consumption power or larger, based on a difference between the predicted amount of consumption power and the amount of remaining power of the battery, and
   wherein the notification unit provides notification of the charging time.

5. A portable electronic apparatus comprising:
   a measurement unit that measures exercise information of a user during a training, by a sensor;
   a battery that supplies power to the measurement unit;
   a processor that calculates a time available for operation based on an amount of remaining power of the battery, calculates a measurement prediction time corresponding to a period from start to end of the measurement during the training, based on a menu for the training and based on biological information on the user measured using the sensor or a physical length level on the user, and compares the time available for operation and the measurement prediction time; and
   a notification unit that provides a notification before the start of the training, when the processor determines that the measurement prediction time is longer than the time available for operation.

6. The portable electronic apparatus according to claim 5, further comprising:
   a solar battery that supplies generated power to the battery,
   wherein the processor calculates the time available for operation based on the amount of remaining power of the battery and an amount of power that is generated by the solar battery.

7. The portable electronic apparatus according to claim 6, wherein, when the processor determines that the measurement prediction time is longer than the time available for operation, the processor determines a condition for changing the menu for the training based on the menu for the training and the amount of remaining power of the battery, in order for the measurement prediction time to be the time available for operation or lower, and
   wherein the notification unit notifies the user of the condition for the changing.

8. The portable electronic apparatus according to claim 7, wherein the processor calculates a measurement periodicity in intermittent operation of the measurement unit, as the condition for the changing.

9. The portable electronic apparatus according to claim 7, wherein the measurement unit includes a GPS module which measures a positional information on the user, and wherein the processor calculates the condition for the changing, which includes stopping of the GPS module, as a condition for changing a measurement condition.

10. The portable electronic apparatus according to claim 7, wherein in a case where, as a result of comparison, the time available for operation is shorter than a remaining time that corresponds to a period remains to measure the exercise information after the start of the training, the processor proposes changing of a measurement condition to the user by the notification unit.

11. The portable electronic apparatus according to claim 7, wherein in a case where, due to charging of the battery, the time available for operation that is calculated by the processor based on the amount of remaining power of the battery is longer than the measurement prediction time, the notification unit notifies the user that the time available for operation is longer than the measurement prediction time.

\* \* \* \* \*